(12) United States Patent
Kristiansson et al.

(10) Patent No.: US 7,368,739 B2
(45) Date of Patent: May 6, 2008

(54) MULTILAYER DETECTOR AND METHOD FOR SENSING AN ELECTRON BEAM

(75) Inventors: Anders Kristiansson, Lund (SE); Lars-Åke Näslund, Furulund (SE); Hans Hallstadius, Lund (SE)

(73) Assignee: Tetra Laval Holdings & Finance S.A., Pully (CH)

( * ) Notice: Subject to any disclaimer, the term of this patent is extended or adjusted under 35 U.S.C. 154(b) by 272 days.

(21) Appl. No.: 11/258,215

(22) Filed: Oct. 26, 2005

(65) Prior Publication Data

US 2007/0090303 A1 Apr. 26, 2007

(51) Int. Cl.
*H01J 37/244* (2006.01)

(52) U.S. Cl. .................... 250/492.3; 250/397

(58) Field of Classification Search ............. 250/492.3, 250/397
See application file for complete search history.

(56) References Cited

U.S. PATENT DOCUMENTS

| | | | |
|---|---|---|---|
| 3,056,059 A | 9/1962 | Hermsen | |
| 3,338,653 A | 8/1967 | Anton | |
| 4,644,167 A | 2/1987 | Sorber | |
| 6,429,444 B1 * | 8/2002 | Korenev et al. | 250/492.3 |
| 6,657,212 B2 | 12/2003 | Komori et al. | |
| 2004/0119024 A1 | 6/2004 | Avnery | |

FOREIGN PATENT DOCUMENTS

| | | |
|---|---|---|
| DE | 20 47 593 A1 | 9/1972 |
| DE | 44 29 925 C1 | 11/1995 |
| EP | 0 174 691 A1 | 3/1986 |
| EP | 0 234 821 A2 | 9/1987 |
| EP | 0 239 808 A1 | 10/1987 |
| GB | 606013 A | 8/1948 |
| GB | 2337108 A | 11/1999 |
| WO | WO 8603332 A1 | 6/1986 |
| WO | WO2004/061890 A2 | 7/2004 |

OTHER PUBLICATIONS

PCT Search Report-PCT/SE2006/001146-dated Feb. 23, 2007.
PCT Search Report-PCT/SE2006/001147-dated Feb. 23, 2007.
PCT Written Opinion-PCT/SE2006/001147-dated Feb. 23, 3007.
UK Search Report-Gb 9910565.2-dated Jul. 12, 1999.

* cited by examiner

*Primary Examiner*—Kiet T. Nguyen
(74) *Attorney, Agent, or Firm*—Buchanan Ingersoll & Rooney PC (57) ABSTRACT

A detector and method are disclosed for sensing an intensity of an electron beam. An exemplary detector includes a multilayer composite structure having a conductive core, an insulating layer formed on the conductive core, and an outer conductive layer electrically connected to a voltage potential and formed on the insulating layer. A support is configured to locate the conductive core in alignment with an electron beam generator, between an electron beam generator and a target area, and within a direct path of an electron beam to be generated by the electron beam generator.

25 Claims, 5 Drawing Sheets

MULTILAYER DETECTOR AND METHOD FOR SENSING AN ELECTRON BEAM

BACKGROUND

Electron beams are used in a variety of applications including, but not limited to irradiation of packaging materials for sterilization purposes. For example, packaging materials such as cartons used to hold liquids for human consumption are sterilized using electron beam irradiation. To provide on-line control of the intensity of the electron beam, and to monitor uniformity variations, electron sensors are used for dose irradiation measurement. A signal from the sensor is analyzed and fed back into an electron beam control system as a feedback control signal. In the sterilization of packaging material, such sensor feedback can be used to assure a sufficient level of sterilization. Different levels of sterilization can be chosen depending on how long shelf-life is desired and whether the distribution and storage of the packages is made in chilled or ambient temperature.

One kind of existing sensor for measuring electron beam intensity, based on direct measuring methods, uses a conductor placed within a vacuum chamber. The vacuum chamber provides isolation from the surrounding environment. Because the vacuum-based sensors are relatively large, they are located at positions outside the direct electron beam path to avoid shadowing of target objects. Shadowing can, for example, preclude proper irradiation (and thus, proper sterilization) of packaging material. Therefore, these sensors rely on secondary information from a periphery of the beam, or information from secondary irradiation, to provide a measurement.

In operation, electrons from the electron beam which have sufficient energy will penetrate a window, such as a titanium (Ti) window of the vacuum chamber and be absorbed by the conductor. The absorbed electrons establish a current in the conductor. The magnitude of this current is a measure of the number of electrons penetrating the window of the vacuum chamber. This current provides an indirect measure of the intensity of the electron beam at the sensor position.

A known electron beam sensor having a vacuum chamber with a protective coating, and an electrode representing a signal wire inside the chamber, is described in published U.S. patent application No. US 2004/0119024. The chamber walls are used to maintain a vacuum volume around the conductor. The sensor described includes a vacuum chamber window accurately aligned with the electrode to sense the electron beam density. The sensor is configured for placement at a location, relative to a moving article being irradiated, opposite the electron beam generator for sensing secondary irradiation. A similar electron beam sensor is described in patent publication WO 2004 061890. In one embodiment of this sensor the vacuum chamber is removed and the electrode is provided with an insulating film. The insulating film is provided to avoid influence from electrostatic fields and plasma electrons created by the electron beam from substantially influencing the electrode output.

U.S. Pat. No. 6,657,212 describes an electron beam irradiation processing device wherein an insulating film is provided on a conductor, such as a stainless steel conductor, of a current detection unit placed outside a window of an electron beam tube. A current measuring unit includes a current meter that measures current detected. This patent describes advantages of a ceramic coated detector.

SUMMARY

A detector is disclosed for sensing an intensity of an electron beam, comprising: a multilayer composite structure having a conductive core, an insulating layer formed on the conductive core, and an outer conductive layer electrically connected to a voltage potential and formed on the insulating layer; and a support configured to locate the conductive core in alignment with an electron beam generator, between the electron beam generator and a target area, within a direct path of an electron beam to be generated by the electron beam generator.

Also disclosed is a method for irradiating a target area with an electron beam emitted along a path. The method comprises emitting an electron beam through an electron exit window and along a path; detecting the electron beam exiting the electron exit window, the detecting being performed with a multilayer composite structure having a conductive core, an insulating layer formed on the conductive core, and an outer conductive layer formed on the insulating layer, wherein the outer conductive layer is connected to a voltage potential.

An apparatus is disclosed for irradiating a target area with an electron beam emitted along a path, comprising: means for emitting an electron beam out through an electron exit window and along a path; and means for detecting the electron beam exiting the electron exit window, the detecting being performed with a composite structure having a conductive core, an insulating layer formed on the conductive core, and an outer conductive layer formed on the insulating layer, wherein the outer conductive layer is connected to a voltage potential.

BRIEF DESCRIPTION OF THE DRAWINGS

Other features and embodiments will become apparent to those skilled in the art upon reading the following detailed description of preferred embodiments, in conjunction with the accompanying drawings, wherein like reference numerals have been used to designate like elements, and wherein.

DETAILED DESCRIPTION

Figure 1:
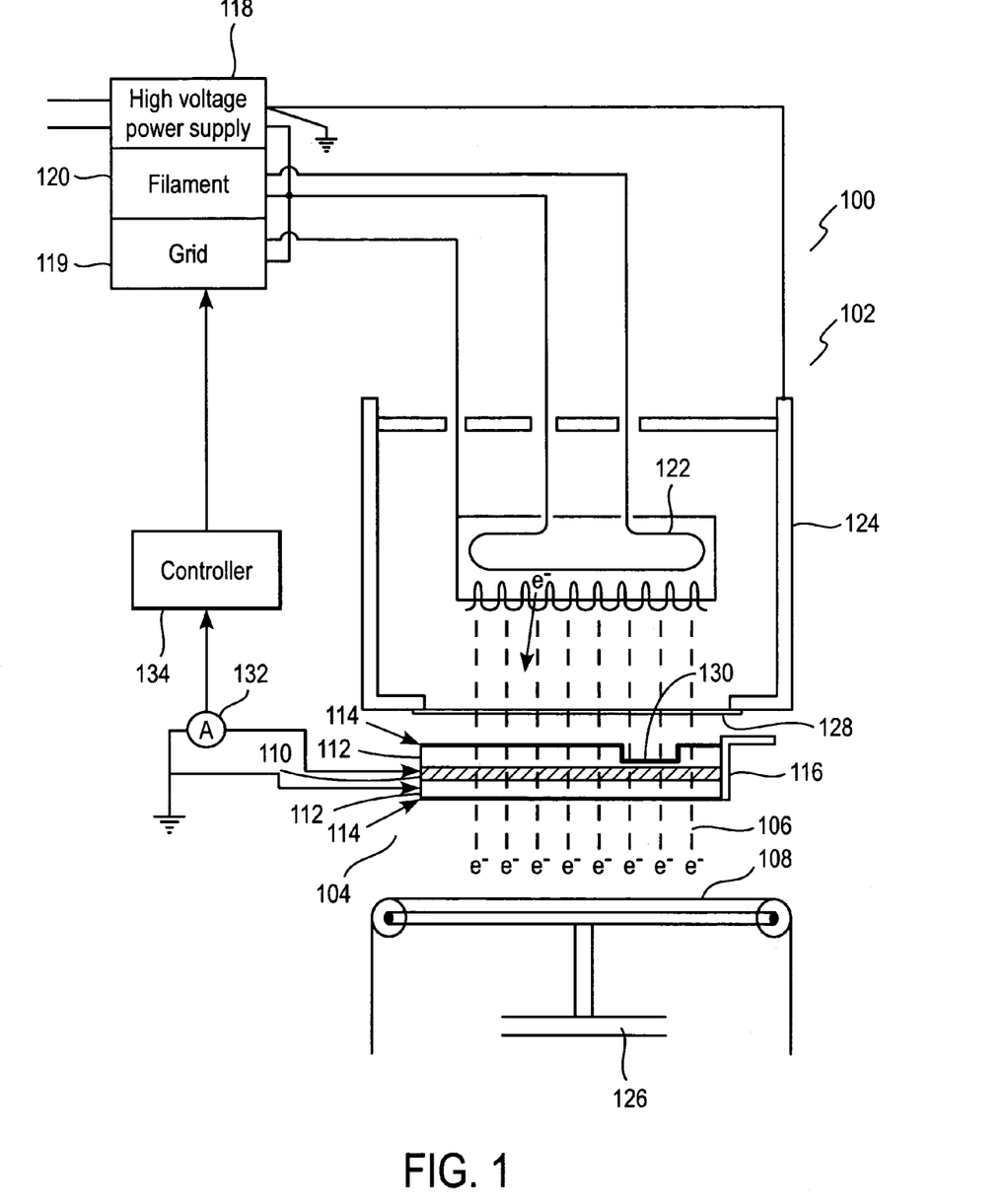
FIG. 1 shows an exemplary electron beam generator and associated electron beam multilayer detector according to an exemplary embodiment.

FIG. 1 shows an exemplary system 100 which includes, in combination, means for emitting an electron beam, such as an electron beam generator 102, and means for detecting the electron beam, such as a detector 104. The detector 104 is provided for sensing an intensity (e.g., a momentary intensity) of an electron beam 106 generated by the electron beam generator along a path which irradiates a target area 108.

The detector 104 includes a multilayer composite structure having a conductive core 110, an insulating layer 112, and an outer conductive layer 114 formed on the insulating layer 112. In an exemplary embodiment, the outer conductive layer 114 is connected to a ground potential of the detector (e.g., a ground potential of the exemplary system 100), or is connected to a voltage potential sufficient to impact a rate at which electrons are drawn from plasma in a vicinity of the detector.

As referenced herein, such a rate can be determined empirically by adjusting the voltage applied to the outer conductive layer 114 until a desired level of consistency and accuracy in the measurement of the electron beam intensity is achieved over a specified period of time. During this specified period of time, the electron beam intensity can be monitored, for example, by connecting the outer conductive layer to a test potential, and by simultaneously using a second independent detector (configured similar to the detector of FIG. 1, or other suitable configuration, with its outer layer at ground potential). The second detector can be periodically placed in the electron beam path over the specified period of time to measure the electron beam intensity during a setup phase. The second detector, when periodically inserted into the electron beam path, can be used to obtain a measurement which is compared against the measurement obtained using the FIG. 1 detector (which is continuously maintained within the electron beam path). Between measurements, the second detector can be removed from the electron beam path and any plasma buildup can be discharged. The voltage potential on the FIG. 1 detector can be adjusted over different setup phase cycles until a voltage potential applied to the outer conductive layer is identified which provides a desired consistency and accuracy of the FIG. 1 detector measurements. In an exemplary embodiment, a voltage potential on the order of 0 to 10 volts can be applied to the outer conductive layer.

A support 116 is provided, and is configured to locate the composite structure in alignment with an electron beam generator, such as the electron beam generator 102. The detector 104 can be insulated from the support 116. The support locates the composite structure between the electron beam generator and the target area 108, within a direct path of an electron beam to be generated by the electron beam generator 102. As referenced herein, the phrase "within a direct path" refers to a location between an electron beam exit window and a target area, such that electrons along the width of the beam 106 (i.e., the entire beam, or any suitable portion thereof) are sensed and not only the electrons of a limited area. Electrons from the beam in parallel paths impact a target object placed in the target area 108.

The electron beam generator 102, as shown in the exemplary FIG. 1 embodiment, includes a high voltage power supply 118, suitable for providing sufficient voltage to drive the electrical beam generator for the desired application. The electron beam generator also includes a filament power supply 120 referenced to the high voltage of the high voltage power supply 118, which transforms power from the high voltage power supply 118 to a suitable output voltage for an electron emitting filament 122 of the electron beam generator. In addition, the high voltage power supply 118 includes a grid control 119.

The filament 122 can be housed in a reflector inside a vacuum chamber 124. In an exemplary embodiment, the vacuum chamber 124 can be hermetically sealed. In operation, electrons (e) from the filament 122 are emitted along an electron beam path, such as the path of electron beam 106, in a direction towards the target area 108.

In an exemplary embodiment, the detector 104 can be used in combination with a support used to hold a target material. Such a support is represented in the exemplary embodiment of FIG. 1 as a packaging device 126, for example, a packaging material web transport roller or any other suitable device. The packaging device 126 is used to hold a target material in the target area 108 at a desired measurement position relative to the conductive core 110 of the detector 104.

In the exemplary FIG. 1 embodiment, the detector 104 is shown as being independent of the electron beam generator 102. However, in an alternate embodiment, the electron beam 106 generated by the filament 122 can pass through an exit window 128 of the electron beam generator. The exit window 128 can be used for diffusing the electron beam into a more uniform beam, and for focusing the electron beam toward the target area 108. In an exemplary embodiment, the detector 104 can be formed on, or attached to, the exit window 128.

The exemplary detector 104 of FIG. 1 includes an optional window 130. The window 130 can be formed on a portion of the detector 104 facing the electron beam generator 102. The exemplary window 130 can be formed, for example, by etching a portion of the insulating layer 112, to create an area of reduced diameter so that electrons from the filament 122 can penetrate to the conductive core 110 in this region.

In the exemplary FIG. 1 embodiment, a cross-sectional view of a cylindrical, coaxial detector 104 is provided. However, the detector can include a multilayer composite structure formed in any of a variety of configurations. For example, the composite structure can be a coaxial configuration, or can be a flat sandwich configuration, or any other desired configuration. The window 130 can be formed regardless of the configuration used. The use of the window allows the insulating layer to be used for filtering electrons of insufficient energy from reaching the conductive core, yet allows measurements of the electron beam in a very specific area of the electron beam.

When an electron emitted from the filament 122 travels toward the target area, it will collide with air molecules along this path. The emitter electrons can have sufficient energy to ionize the gas along this path, thereby creating a plasma. The plasma contains ions and electrons. Plasma electrons are secondary electrons, or thermal electrons, with low energy compared to the electrons from the electron beam. The plasma electrons have randomized vector velocity and can only travel a distance whose length is a small fraction of the mean free path for the beam electrons.

In an exemplary embodiment, the plasma electrons can have energies below a first threshold, such as on the order of a few electron volts (eV). The emitted electrons can have an energy above the threshold, such as on the order of tens of electron volts (eV). For example, penetration of an emitter electron can be on the order of 10-50 micrometers (μm) (in water 1.0 g/cc), while plasma electrons will penetrate less than 1 micrometer (1.0 g/cc).

To minimize and/or eliminate plasma electrons from reaching the conductive core, the thickness of the composite coating over the conductive core can be selected as a function of the desired threshold. In the foregoing example, this thickness can be greater than 1 micrometer, but not so thick as to filter out emitted electrons of desired energies from contacting the conductive core. The outer conductive layer 114 in the window 130, can be configured relatively thin, such as on the order of a few hundred nanometers (nm) for the exemplary dimensions of a multilayer detector discussed above.

Although the insulating layer 112 can be formed of sufficient thickness to prevent plasma electrons from reaching the conductive core, the outer conductive layer 114 is provided to "bleed off" the plasma electrons and prevent their build-up on the surface. Such a build-up can, in some circumstances, repel desired emitted electrons from reaching the conductive core. The outer conductive layer can also be configured to provide environmental protection for the insulating layer.

The thickness of the conductive core can be of any suitable dimension. For example, a relatively small conductive core can be used relative to the composite thickness of the insulating layer and the outer conductive layer. In an exemplary embodiment, the diameter of the composite structure can be on the order of 0.3 millimeters (mm), or lesser or greater as desired. If sized of a suitably small dimension, the detector can be positioned within a direct path of the electron beam, between the filament 122 and the target area 108, without shadowing the target area.

Electrons which reach the conductive core can be detected by a current meter 132. The detected electrical current can be considered a measure of electron beam intensity in an area of electron beam which impacts the window 130. An output from the current meter can be supplied to a controller 134 configured, for example, as a programmable computer, processor or other similar device. The controller 134 can serve as a means for adjusting an intensity of the electron beam in response to an output of the electron beam detector. For example, the controller 134 can adjust the electron beam intensity to a desired setpoint by comparing the output of the current meter 132 with the setpoint and then adjusting the outputs of the power supply 118, filament 120 and/or grid control 119 to achieve regulated outputs from any one or more of these components.

In an exemplary embodiment, the conductive core can be a copper or stainless steel signal wire, or any other suitable conductor. The insulating layer 112 can, for example, be any suitable insulator including, but not limited to, silicon dioxide ($SiO_2$) or Alumina ($Al_2O_3$). Any suitable conductor can be used for the outer conductive layer 114 including, but not limited to, gold.

As already mentioned, the exemplary detector 104 of FIG. 1, through the use of window 130, can be used to measure electron beam intensity in a specified area of the beam. Because the detector can be formed with a relatively small dimension (e.g., 0.3 millimeters to 1 millimeter, or less), multiple electron windows can be produced along the length of the conductive core to provide an average intensity measure along the conductive core.

Figure 2:
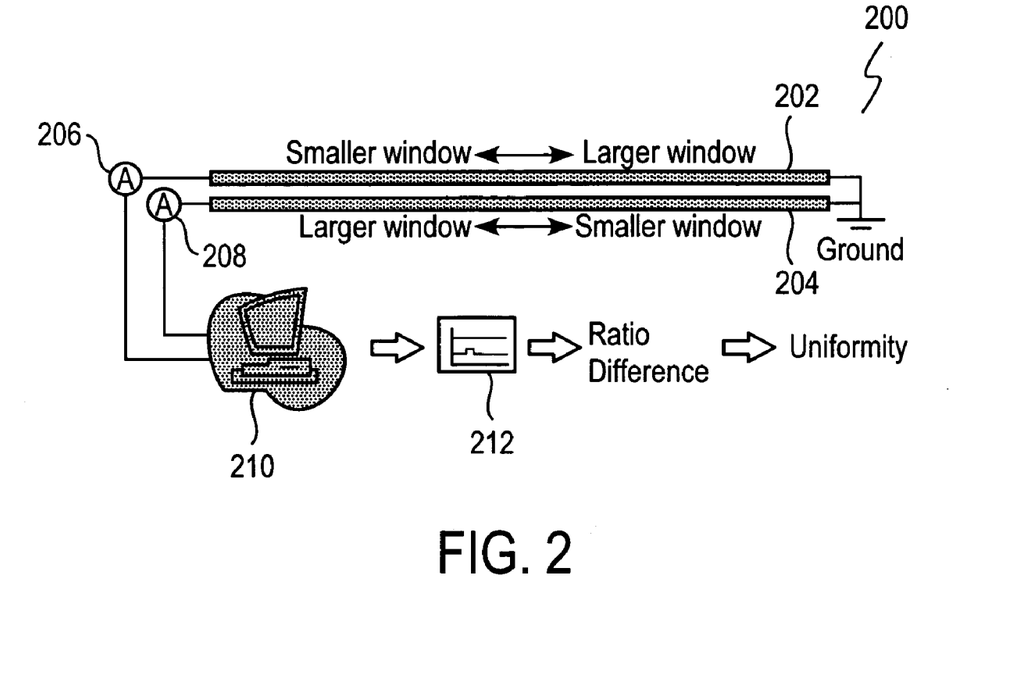
FIGS. 2 and 3 show exemplary embodiments of multi-detector configurations.

FIG. 2 shows an exemplary embodiment of a detector 200 wherein multiple composite structures are provided. Each of the composite structures can be configured in a manner similar to that described with respect to FIG. 1. However, in this exemplary embodiment, each of the composite structures includes plural windows of varying dimensions.

In FIG. 2, multiple composite structures 202 and 204 having parallel conductive cores are provided, wherein an outer conductive layer of each composite structure includes multiple windows formed with varying dimensions, and wherein the multiple composite structures are arranged side by side (in parallel) within the electron beam path. Electrons emitted from a filament (such as filament 122 of FIG. 1) could pass through the first composite structure 202 or through the second composite structure 204. A window having a first dimension along a length of the first composite structure 202 is parallel to a window having a second dimension along a length of a second composite structure. Those skilled in the art will appreciate that some of the parallel windows of the first and second conductive cores can be of the same dimension (e.g., windows located at a central region along the length of the first and second composite structures).

In an exemplary embodiment, the size of the windows can be varied from one end of the conductive core to the other. For example, the detector 200 includes a first composite structure 202 wherein windows become larger going in a first direction, from one end of the conductive core to the other. In the second composite structure 204, the windows become smaller along the same first direction, to achieve parallel, opposing windows of the first and second composite structures which are of varying dimension.

In an exemplary embodiment, the total window area can be the same for both of the multilayer composite structures 202 and 204. As such, if the electron beam is of a symmetric intensity across its width, the signals generated by current detectors 206 and 208, as analyzed in a processor 210, will be equal. However, if the electron beam intensity is non-symmetrical (i.e., non-uniform across its width), the current signals from the current detectors 206 and 208, as processed in a processor 210, will differ.

By combining the outputs from current detectors 206 and 208, the processor 210 can be programmed to identify asymmetries in an electron beam and to produce an output (e.g., display) which distinguishes the direction and magnitude by which the intensity output from the electron beam is tilted. A ratio difference can be produced as an output 212 of the processor 210, and used as a measure of electron beam uniformity. The same effect can be achieved using, for example, a first conductive core having large windows in a central area (e.g., near a midpoint of the detector) and small windows at the ends of the detector. The first embodiment would give a left-right asymmetry information and the second embodiment would give center-side asymmetry information. Combinations of these detections can also be used.

Figure 3:
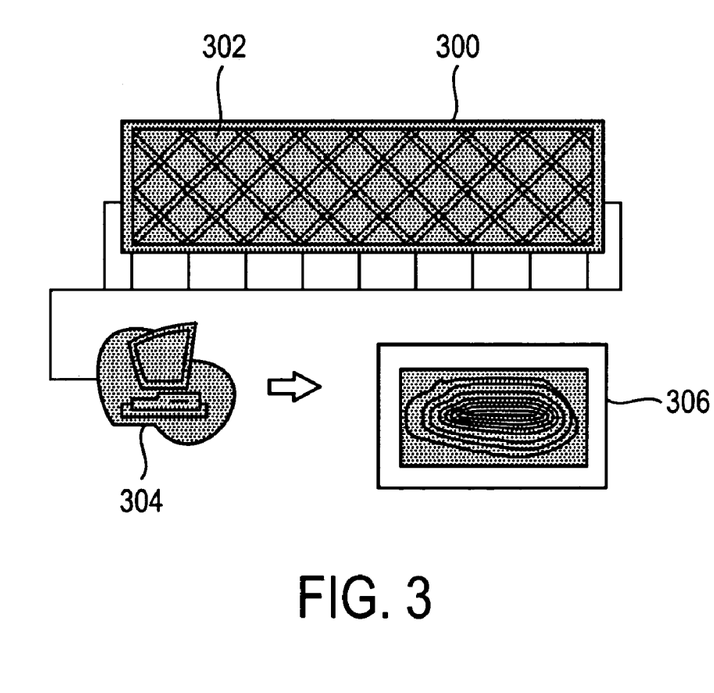

Although FIG. 2 illustrates an exemplary embodiment wherein the uniformity of electron beam intensity across a width of the beam is detected, those skilled in the art will appreciate that multidimensional analysis of electron beam intensity can also be measured. FIG. 3 shows an exemplary embodiment wherein two dimensional measurement of electron beam intensity can be provided. Here, an exemplary array of composite structures is formed as a grid to detect energy of an electron beam at each of plural locations within two dimensions of a cross section of the electron beam path (that is, in a plane transverse to the electron beam path).

In the detector 300 of FIG. 3, an array of composite structures 302 can be provided in a grid arrangement which can be attached to an electron exit window. The detector 300 can thus be considered as a mesh of detectors, or a dose mapping unit. Information from each conductive core (e.g., signal amplitudes, signal differences/ratios, conductive core position and so forth), can be used to produce an emission intensity plot via a processor 304. An exemplary plot 306 produced by the processor 304 is illustrated in FIG. 3.

In the exemplary FIG. 3 embodiment, the multilayer detector 300 can be formed as the exit window 128 of the electron beam generator, or can be configured for attachment to the exit window 128. In addition, in the exemplary FIG. 3 embodiment, the composite structures 302 can be arranged at angles to one another in a plane transverse to the electron beam path. Such a configuration can result in reduced (e.g., minimal) shadowing of a target material passing beneath the grid.

For example, where a target object, such as a packaging material, passes from a lower portion of the diagram as shown in FIG. 3 to a top of the diagram, all portions of the packing material will be equally irradiated by the electron beam as the material passes. However, the angled composite structures will sense the electron beam at multiple locations across its two dimensional cross section, thereby providing an accurate plot of electron beam intensity without impacting the sterilization process. It should be understood that in an exemplary embodiment, the angle can be 0 or 90 degrees, or other suitable angle (e.g., the detector can be positioned at right angles to the electron exit window).

Figure 4:
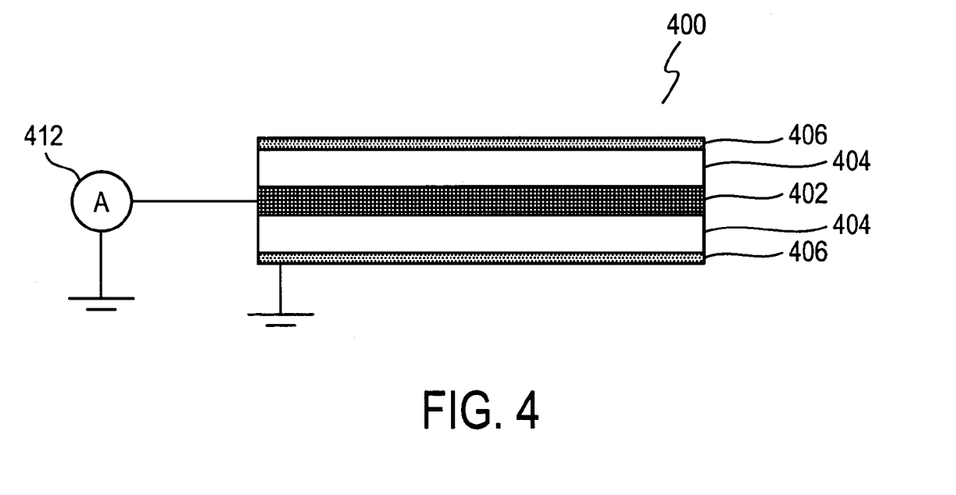
FIGS. 4, 5, 6A-6C and 7 show alternate cross-sectional embodiments of multilayer detectors which can be configured in a variety of shapes including, but not limited to, coaxial detectors.

FIG. 4 shows an exemplary embodiment wherein the detector is formed using a multilayer composite structure having uniform thickness. As shown in FIG. 4, a multilayer detector 400 includes a conductive core 402, an insulating layer 404 and an outer conductive layer 406, formed in a manner similar to the FIG. 1 detector with exception of window 130.

Figure 5:
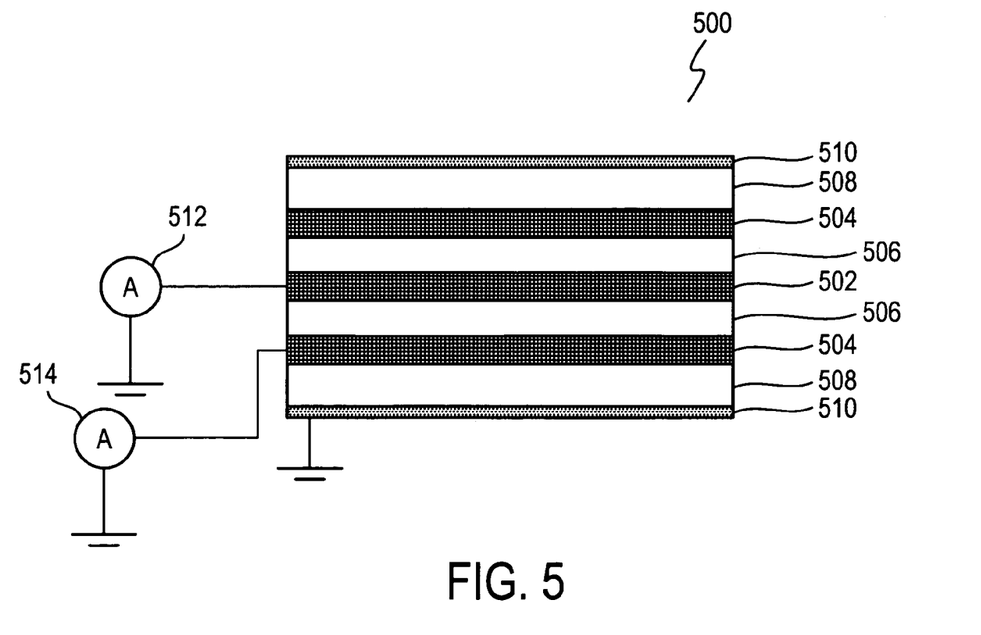

FIG. 5 shows an exemplary embodiment of plural composite structures used to form a multilayer detector 500 wherein first and second conductive cores 502 and 504 are provided. The second conductive core 504 is formed on a first insulating layer 506 of the multilayer detector 500. A second insulating layer 508 is formed on the second conductive core 504. The outer conductive layer 510 is formed on the second insulating layer 508 such that the second conductive core 504 and the second insulating layer are formed between the first conductive core 502 and the outer conductive layer 510.

In this exemplary embodiment, the detector can be oriented along the electron beam path such that electrons generated along the path pass through the outer conductive layer and the second conductive core before contacting the first conductive core. Such a configuration allows a mapping of electron beam intensity and energy using, for example, current detectors 512 and 514. These detectors can be connected to a processor for mapping electron beam intensity as discussed with FIGS. 2 and 3.

The detector shown in FIG. 5 allows for monitoring of both the intensity and the energy of the electrons. Electrons absorbed in the innermost first conductive layer have a higher energy, while electrons absorbed in the second conductive layer will have lower energy. An average energy of the electrons reaching each layer can be calculated via a controller, such as the controller 134 of FIG. 1. In this case, the controller can output an intensity vs energy plot. The number of layers included in the detector can be used to define a resolution and a thickness of the layers can be used to define an efficiency of the detector.

Figure 6A:
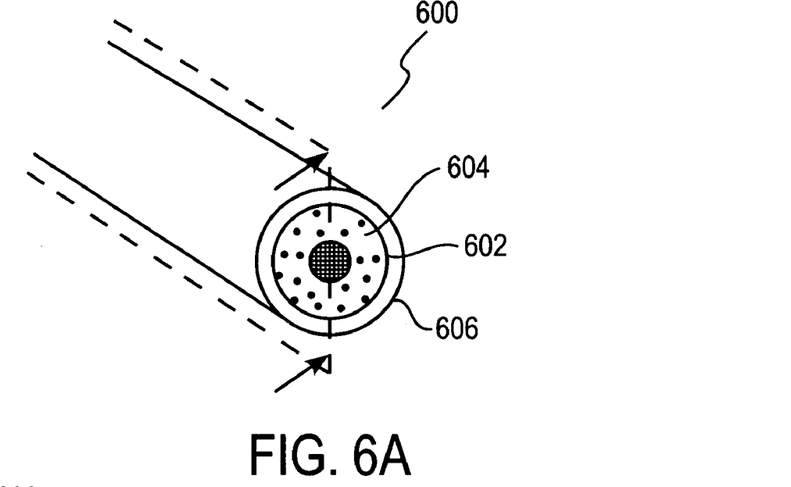
Figure 6B:
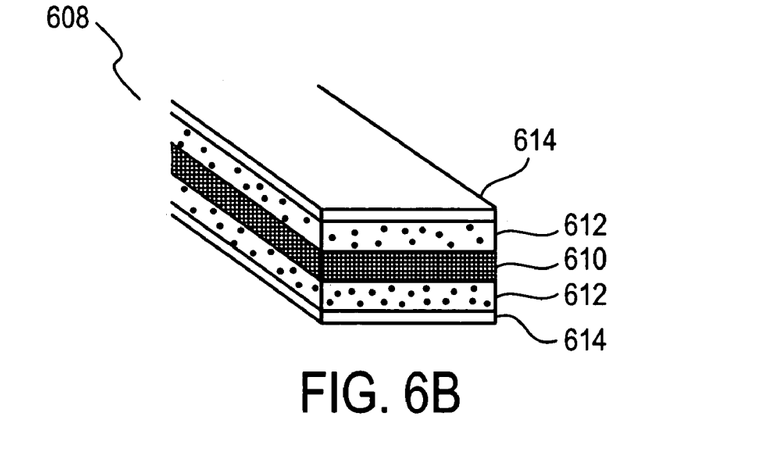
Figure 6C:
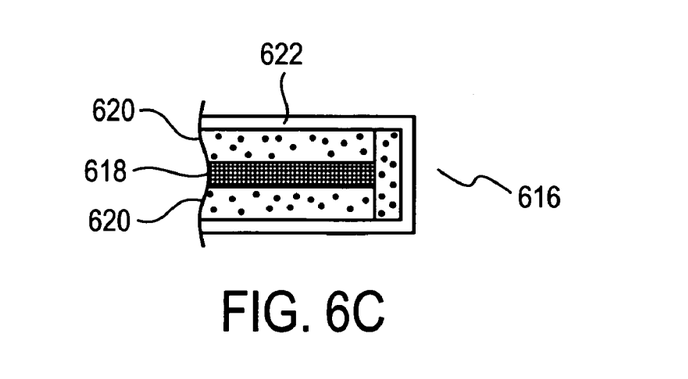

FIGS. 6A-6C illustrate cross-sectional views of different detector configurations. In FIG. 6A, a cylindrical coaxial detector 600 includes an inner conductive core 602, insulating layer 604 and outer conductive layer 606 which can be connected to a voltage potential (e.g., ground).

FIG. 6B shows an alternate, non-cylindrical sandwich configuration of a detector 608 having an inner core layer 610, insulating layers 612 and outer conductive layer 614. The outer layer 614 can be connected to a voltage potential as previously discussed.

FIG. 6C shows an exemplary modification of the exposed ends, which can be used in conjunction with the ends of the FIG. 6A coaxial configuration and/or the sides of the FIG. 6B sandwich configuration. In FIG. 6C, a conductive inner core 618 is provided, along with an insulating layer 620. An outer conductive layer 622 covers the insulating layer, such that the inner conductive core is completely encased within the insulating layer and the outer conductive layer, such that the inner core is surrounded by the outer conductive layer.

Figure 7:
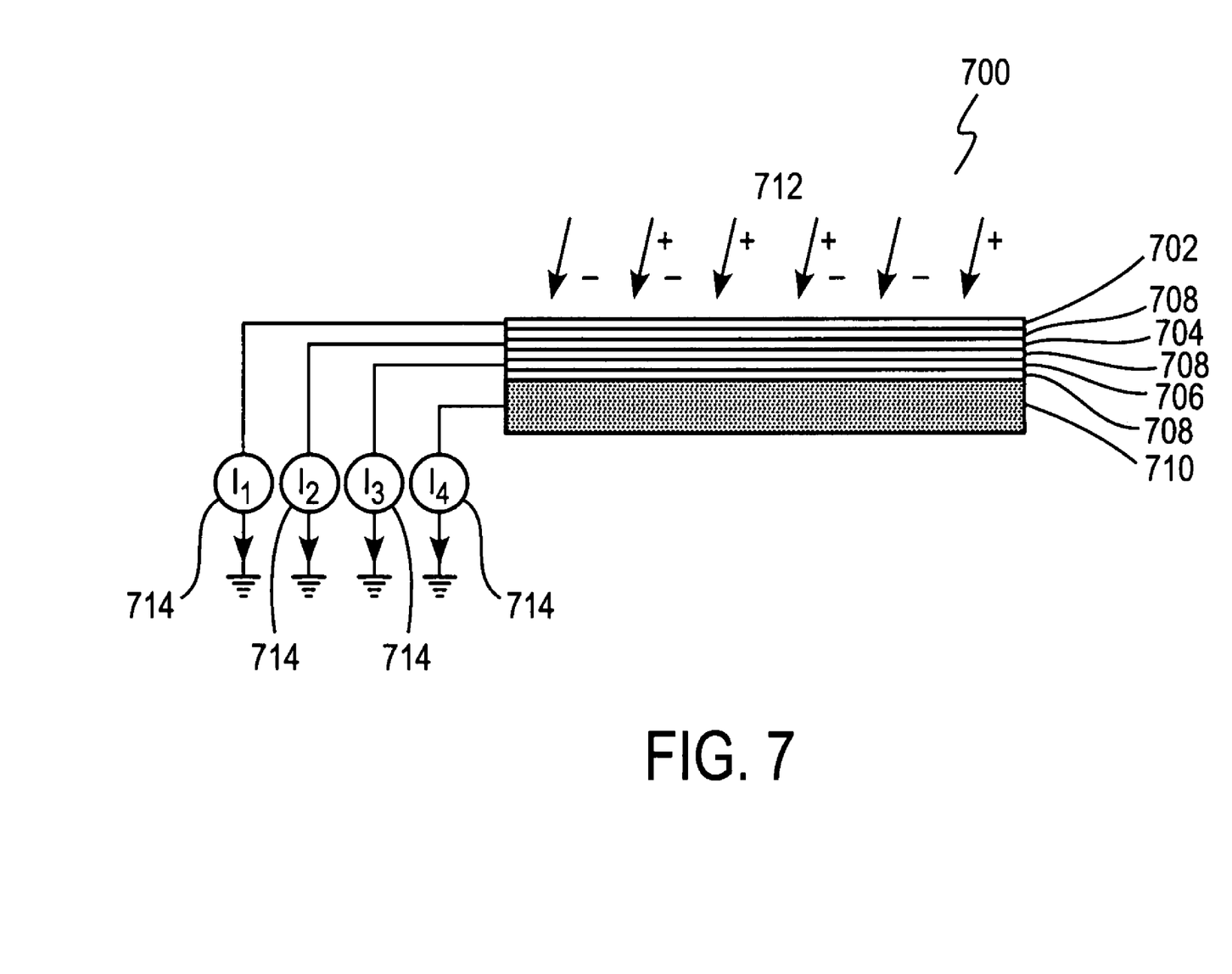

FIG. 7 shows an exemplary embodiment of a detector 700 which can measure electron beam intensity, and which can determine an impact of any plasma in a vicinity of the detector on the intensity measurement. For example, to measure the influence of plasma, a tunable voltage can be connected to a conductive core. A DC voltage can be tuned (e.g., between approximately −200 to +200 volts, or lesser or greater), to vary a recorded sensing current in a reproducible way. At a negative bias voltage, electrons in the electron beam are repelled. At a lower threshold DC voltage, the recorded current originates only from positive ions in the plasma.

Differential measurements can be made with respect to parameters, such as instance angle of view, bias voltage or geometry. Such measurements can be based on recording two signals from two different conductive cores such that an actual electron signal is calculated from the difference.

In FIG. 7, an exemplary detector 700 is formed as a multilayer charge collector wherein the uppermost layer (in a direction of the electron beam generator) is configured as an outer conductive surface 702. Here, each layer other than the bottom substrate layer 710, can be configured of a thickness on the order of, for example, 0.1 to 1 micrometer (μm) thick. In FIG. 7, the outer conductive surface 702, and additional layers 704 and 706 representing multiple conductive cores, are configured in a manner similar to that discussed with respect to FIG. 6. The conductive cores are separated from one another by insulating layers 708. A substrate 710 serves as a support structure.

A sum of currents as measured by current detectors 714 can be considered proportional to electron beam intensity, wherein a relative magnitude provides information about energy distribution in a manner similar to that discussed with respect to FIG. 5. The top layer 702 can be directly in the path of electrons from electron beam 712. Although FIG. 7 includes an outer conductive surface and two conductive cores, any number of such cores can be included, as desired to achieve a satisfactory resolution.

An exemplary method for irradiating a target area with an electron beam emitted along a path can be appreciated with reference to the exemplary FIG. 1 embodiment. Here, an electron beam 106 is emitted from a vacuum chamber 124 along a path. The electron beam exiting the vacuum chamber can be detected using the multilayer detector 104 having the composite structure already discussed. Alternately, any of the detectors described herein, or readily apparent variations thereof, can be used.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A detector for sensing an intensity of an electron beam generated, comprising:
   a multilayer composite structure having a conductive core, an insulating layer formed on the conductive core, and an outer conductive layer electrically connected to a voltage potential and formed on the insulating layer; and
   a support configured to locate the composite structure in alignment with an electron beam generator, between the electron beam generator and a target area, within a direct path of the electron beam to be generated by the electron beam generator.

2. The detector according to claim 1, wherein the outer conductive layer is connected to ground potential of the detector.

3. The detector according to claim 1, wherein the outer conductive layer is connected to a voltage potential sufficient to impact a rate at which electrons are drawn from plasma in a vicinity of the detector.

4. The detector according to claim 1, wherein the outer conductive layer surrounds the conductive core.

5. The detector according to claim 1, in combination with an electron beam generator comprising:
an electron beam generator for emitting an electron beam along a path; and
a vacuum chamber within which a filament of the electron beam generator is located.

6. The detector according to claim 5 in combination with a support to hold a target material in a target area, the detector being positioned between the electron beam generator and the target area.

7. The detector according to claim 5, wherein the composite structure is formed on an electron beam exit window of the vacuum chamber.

8. The detector according to claim 1, comprising:
a current meter to detect electrical current in the conductive core as a measure of electron beam intensity.

9. The detector according to claim 1, comprising:
an array of the composite structures formed as a grid to detect an intensity of the electron beam at each of plural locations within the path.

10. The detector according to claim 9, wherein the composite structures are arranged at angles relative to a desired transport direction of a target material within the target area, and in a plane transverse to the path of the electron beam.

11. The detector according to claim 1, comprising:
a second conductive core formed on the insulating layer; and
a second insulating layer formed on the second conductive core, wherein the outer conductive layer is formed on the second insulating layer such that the second conductive core and the second insulating layer are formed between the first conductive core and the outer conductive layer.

12. The detector according to claim 11, oriented along the path such that electrons generated along the path pass through the outer conductive layer and the second conductive core before contacting the conductive core.

13. The detector according to claim 1, comprising:
multiple conductive cores separated by an insulating layer.

14. The detector according to claim 1, wherein the outer conductive layer includes region of reduced thickness to establish a window of reduced cross-section.

15. The detector according to claim 1, wherein the outer conductive layer includes multiple windows formed with varying dimensions.

16. The detector according to claim 1, comprising:
multiple composite structures, wherein the outer conductive layer of each composite structure includes multiple windows formed with varying dimensions, and wherein the multiple composite structures are arranged side by side within the electron beam path such that a window having a first dimension along a length of a first composite structure is parallel to a window having a second dimension along a length of a second composite structure.

17. The detector according to claim 16, comprising:
a first current detector and a second current detector for detecting current within a conductive core of each of the first and second composite structures; and
a processor for combining outputs of the first current detector and the second current detector to identify asymmetries of intensity in an electron beam.

18. Method for irradiating a target area with an electron beam emitted along a path, comprising:
emitting an electron beam through an electron exit window and along a path;
detecting the electron beam exiting the electron exit window, the detecting being performed with a multilayer composite structure having a conductive core, an insulating layer formed on the conductive core, and an outer conductive layer formed on the insulating layer, wherein the outer conductive layer is connected to a voltage potential.

19. Method according to claim 18, wherein the outer conductive layer is connected to a ground potential of the detection.

20. Method according to claim 18, wherein the outer conductive layer is connected to a voltage potential sufficient to impact on rate at which electrons are drawn from plasma in a vicinity of the detector.

21. Method according to claim 18, wherein the composite structure includes a second conductive core and a second insulating layer, and wherein the outer conductive layer is formed on the second insulating layer such that the second conductive core and the second insulating layer are formed between the first conductive core and the outer conducting layer, the method comprising:
mapping energy of an electron beam by detecting electrons which contact the first conductive core and the second conductive core.

22. Method according to claim 21, comprising:
at least three conductive cores insulated from one another.

23. Method according to claim 18, comprising:
measuring electrical current from the conductive core as a measure of electron beam intensity.

24. Method according to claim 18, wherein the detecting is performed with plural composite structures, the method comprising:
comparing a level of electrical current detected in at least two different composite structures as a mapping of electron beam intensity.

25. Apparatus for irradiating a target area with an electron beam emitted along a path, comprising:
means for emitting an electron beam through an electron exit window and along a path;
means for detecting the electron beam exiting the electron exit window, the detecting being performed with a composite structure having a conductive core, an insulating layer formed on the conductive core, and an outer conductive layer formed on the insulating layer, wherein the outer conductive layer is connected to a voltage potential.

* * * * *